US010249540B2

(12) United States Patent
Ando et al.

(10) Patent No.: US 10,249,540 B2
(45) Date of Patent: Apr. 2, 2019

(54) DUAL CHANNEL CMOS HAVING COMMON GATE STACKS

(71) Applicant: International Business Machines Corporation, Armonk, NY (US)

(72) Inventors: Takashi Ando, Tuckahoe, NY (US); Hemanth Jagannathan, Niskayuna, NY (US); ChoongHyun Lee, Rensselaer, NY (US); Vijay Narayanan, New York, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/813,958

(22) Filed: Nov. 15, 2017

(65) Prior Publication Data
US 2018/0337098 A1    Nov. 22, 2018

Related U.S. Application Data

(63) Continuation of application No. 15/596,629, filed on May 16, 2017.

(51) Int. Cl.
*H01L 29/76* (2006.01)
*H01L 29/94* (2006.01)
(Continued)

(52) U.S. Cl.
CPC ........... *H01L 21/823807* (2013.01); *H01L 21/02236* (2013.01); *H01L 21/02532* (2013.01); *H01L 21/28088* (2013.01); *H01L 21/324* (2013.01); *H01L 21/823821* (2013.01); *H01L 21/823828* (2013.01); *H01L 27/0924* (2013.01); *H01L 29/0653* (2013.01); *H01L 29/1054* (2013.01); *H01L 29/16* (2013.01); *H01L 29/161* (2013.01); *H01L 29/4966* (2013.01)

(58) Field of Classification Search
CPC ..... H01L 21/823807; H01L 21/823821; H01L 21/28088; H01L 21/02381
USPC .......................................................... 257/369
See application file for complete search history.

(56) References Cited

U.S. PATENT DOCUMENTS

2007/0099353 A1*  5/2007  Thean ................ H01L 21/845
                                                    438/149
2013/0049121 A1*  2/2013  Baldauf .......... H01L 21/823431
                                                    257/365

OTHER PUBLICATIONS

Ando et al., "Co-Integration of High Carrier Mobililty PFET and NFET Devices on the Same Substrate Using Low Temperature Condensation," U.S. Appl. No. 16/021,377, filed Jun. 28, 2018.
(Continued)

*Primary Examiner* — Theresa T Doan
(74) *Attorney, Agent, or Firm* — Cantor Colburn LLP; Vazken Alexanian

(57) ABSTRACT

Embodiments are directed to a method and resulting structures for a dual channel complementary metal-oxide-semiconductor (CMOS) having common gate stacks. A first semiconductor fin is formed on a substrate. A second semiconductor fin is formed adjacent to the first semiconductor fin on the substrate. An oxide layer is formed over the first and second semiconductor fins and annealed at a temperature effective to increase a germanium concentration of the second semiconductor fin. The annealing process is selective to the second semiconductor fin and does not increase a germanium concentration of the first semiconductor fin.

16 Claims, 9 Drawing Sheets

(51) Int. Cl.
*H01L 21/8238* (2006.01)
*H01L 21/324* (2006.01)
*H01L 27/092* (2006.01)
*H01L 29/06* (2006.01)
*H01L 29/49* (2006.01)
*H01L 29/161* (2006.01)
*H01L 29/16* (2006.01)
*H01L 29/10* (2006.01)
*H01L 21/28* (2006.01)
*H01L 21/02* (2006.01)

(56) References Cited

OTHER PUBLICATIONS

List of IBM Patents or Patent Applications Treated as Related; Date Filed: Nov. 15, 2017, 2 pages.
List of IBM Patents or Patent Applications Treated as Related (Appendix P); Filed Nov. 15, 2017, 2 pages.
Takashi Ando, et al. "Dual Channel CMOS Having Common Gate Stacks," U.S. Appl. No. 15/596,629, filed May 16, 2017.

* cited by examiner

DUAL CHANNEL CMOS HAVING COMMON GATE STACKS

This application is a continuation of U.S. application Ser. No. 15/596,629, titled "DUAL CHANNEL CMOS HAVING COMMON GATE STACKS" filed May 16, 2017, the entire contents of which are incorporated herein by reference.

BACKGROUND

The present invention generally relates to fabrication methods and resulting structures for semiconductor devices. More specifically, the present invention relates to a dual channel complementary metal-oxide-semiconductor (CMOS) having common gate stacks.

In contemporary semiconductor device fabrication processes, a large number of semiconductor devices, such as n-type metal-oxide-semiconductors (NMOS) and p-type metal-oxide-semiconductors (PMOS), are fabricated on a single wafer. In a CMOS integrated circuit (IC), complementary and symmetrical pairs of these NMOS and CMOS transistors are used for logic functions. Complementing every NMOS with a PMOS and connecting both gates and both drains together greatly reduces power consumption and heat generation relative to other logic families. For example, in a CMOS IC a high voltage on the gates will only cause the NMOS to conduct, while a low voltage on the gates causes only the PMOS to conduct.

SUMMARY

Embodiments of the present invention are directed to a method for fabricating a dual channel complementary metal-oxide-semiconductor (CMOS) having common gate stacks. A non-limiting example of the method includes forming a first semiconductor fin on a substrate. A second semiconductor fin is formed adjacent to the first semiconductor fin on the substrate. An oxide layer is formed over the first and second semiconductor fins and annealed at a temperature effective to increase a germanium concentration of the second semiconductor fin. The annealing process is selective to the second semiconductor fin and does not increase a germanium concentration of the first semiconductor fin.

Embodiments of the present invention are directed to a method for fabricating a dual channel complementary metal-oxide-semiconductor (CMOS) having common gate stacks. A non-limiting example of the method includes recessing a portion of a silicon substrate and forming a semiconductor layer including silicon germanium on the recessed portion of the silicon substrate. A first semiconductor fin is formed over an unrecessed portion of the substrate and a second semiconductor fin is formed over the semiconductor layer and adjacent to the first semiconductor fin. An oxide layer including germanium is formed over the first and second semiconductor fins and annealed at a temperature effective to condense the germanium in the oxide layer into a portion of the second semiconductor fin. A shared conductive gate is then formed over a channel region of the first and second semiconductor fins.

Embodiments of the present invention are directed to a method for fabricating a dual channel complementary metal-oxide-semiconductor (CMOS) having common gate stacks. A non-limiting example of the method includes forming a semiconductor fin including silicon and germanium on a substrate. An oxide layer including germanium is formed over the semiconductor fin and annealed at a temperature effective to increase a germanium concentration of the semiconductor fin. The annealing process oxidizes silicon in the semiconductor fin and condenses germanium in the oxide layer according to the reaction (I):

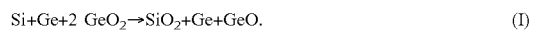

$$Si + Ge + 2\ GeO_2 \rightarrow SiO_2 + Ge + GeO. \qquad (I)$$

Embodiments of the invention are directed to semiconductor device. A non-limiting example of the semiconductor device includes a first semiconductor fin on a substrate and a second semiconductor fin adjacent to the first semiconductor fin on the substrate. The second semiconductor fin includes a bottom portion, a middle portion, and a top portion. The middle portion includes a first concentration of a first material and the top portion includes a second concentration of the first material. The second concentration is higher than the first concentration. A shared conductive gate is formed over a channel region of the first and second semiconductor fins.

Embodiments of the invention are directed to semiconductor device. A non-limiting example of the semiconductor device includes a first semiconductor fin including silicon on a substrate. A second semiconductor fin having a bottom portion, a middle portion, and a top portion is formed adjacent to the first semiconductor fin on the substrate. The bottom portion of the second semiconductor fin does not include germanium. The middle portion of the second semiconductor fin includes a lower concentration of germanium, and the top portion of the second semiconductor fin includes a higher concentration of germanium. A shared conductive gate is formed over a channel region of the first and second semiconductor fins.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
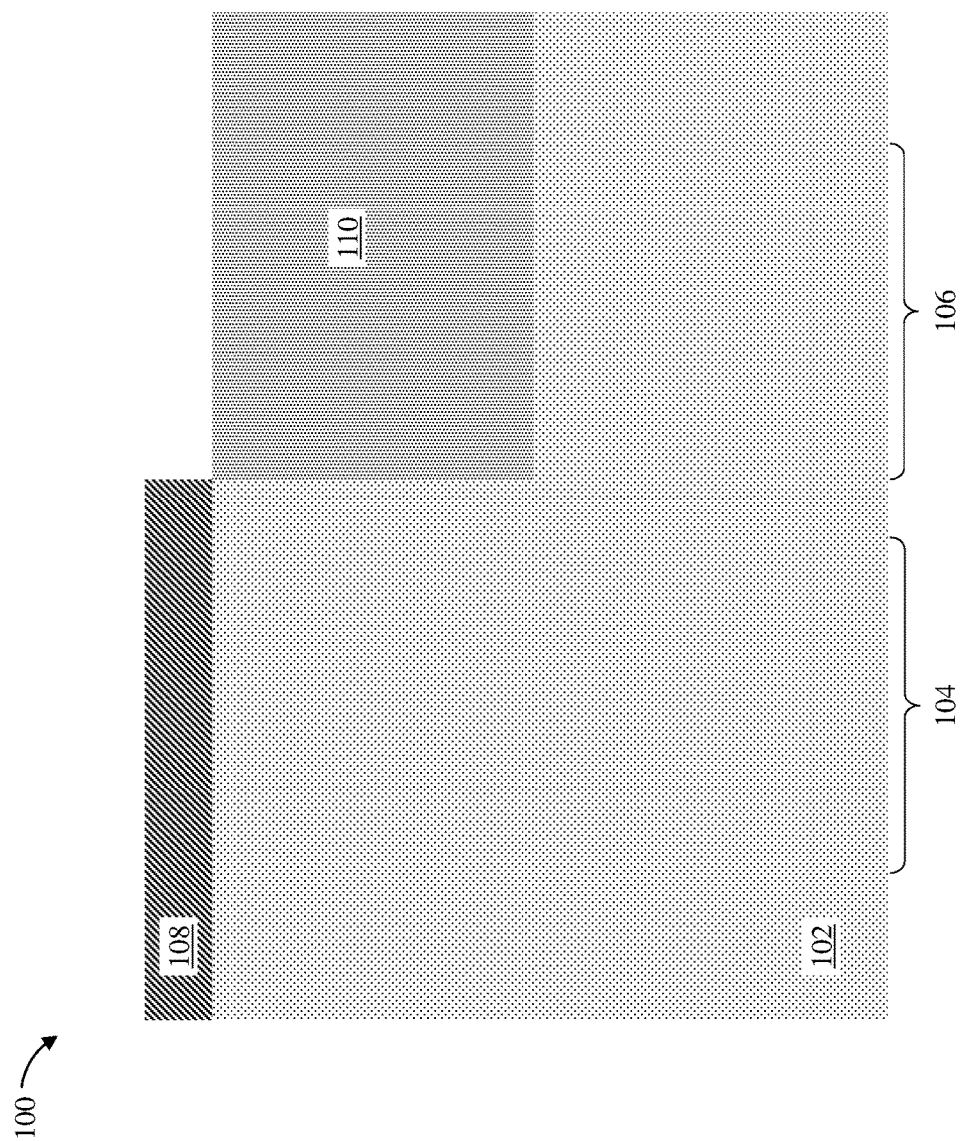
FIG. 1 depicts a cross-sectional view of a semiconductor structure after a processing operation according to one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, the CMOS logic architecture employs complementary NMOS and PMOS pairs for logic functions, resulting in reduced power consumption and heat generation relative to other logic families. There are challenges, however, in scaling the CMOS architecture beyond the 10 nm node. As device feature sizes become smaller, electron and hole mobilities begin to bottleneck device performance improvements. One of the promising CMOS integration schemes for future (sub-10 nm node) architectures is to use strain engineering to improve electron and hole mobilities by modulating mechanical strain in the transistor channels.

One particular challenge in using strain engineering in a CMOS platform is that NMOS and PMOS transistors respond differently to different types of strain. For example, a dual channel CMOS that incorporates a compressively strained $Si_{1-x}Ge_x$ layer for pFETs in tandem with a tensilely strained Si layer for nFETs can provide greatly enhanced electron and hole mobilities. Increasing electron and hole mobilities increases conductivity through the CMOS channels and improves device performance. CMOS circuit designs are simplified if carrier mobility is enhanced equally for both nFET and pFET devices. Designing methods for equally increasing hole and electron mobilities in a dual channel CMOS device is problematic, however, in part because of the difficulty in providing a strained $Si_{1-x}Ge_x$ layer for pFETs having a sufficiently high germanium concentration to meet performance and reliability requirements. In particular, due to the critical thickness of $Si_{1-x}Ge_x$ epitaxial growth on silicon, strained $Si_{1-x}Ge_x$ layers having a high Ge concentration (i.e., greater than 25 atomic percent Ge) cannot be achieved using current CMOS technologies. Moreover, conventional Ge condensation techniques for increasing the Ge concentration of pFETs cannot be used in a dual channel CMOS process because the high temperature oxygen ambient oxidation process (i.e., at greater than about 950 degrees Celsius) also oxidizes the nFET fin. Consequently, conventional dual channel CMOS electron mobility can be approximately two times greater than hole mobility.

Turning now to an overview of aspects of the present invention, one or more embodiments of the invention provide a dual channel CMOS device having common gate stacks. A semiconductor layer having a relatively low germanium (Ge) concentration is formed on a recessed portion of a silicon (Si) substrate. As used herein, a "low" germanium concentration is limited to less than about 25 atomic percent to satisfy $Si_{1-x}Ge_x$ epitaxial growth on silicon critical thickness requirements. The semiconductor layer and the substrate are patterned to form complementary pairs of silicon nFET fins and silicon germanium pFET fins. A germanium-containing oxide layer such as $GeO_2$ is conformally formed over both the nFET and pFET fins. The germanium in the oxide layer is then selectively condensed into the pFET fins.

The Ge condensation process does not require a high temperature (i.e., a temperature of about 500 to about 700 degrees Celsius is sufficient) and can be completed in an inert, oxygen free ambient. In this manner, the selective Ge condensation process enables a strained $Si_{1-x}Ge_x$ pFET having a "high" germanium concentration (i.e., a Ge concentration of greater than about 25 percent). Advantageously, the final germanium content of the pFET fins can tuned by adjusting the thickness of the germanium-containing oxide layer. For example, increasing the thickness of the oxide layer will increase the final Ge concentration of the pFET fins. Moreover, the Ge condensation process is selective to the pFET fins and does not modify the nFET fins. Consequently, the process is fully compatible with Si/SiGe dual channel CMOS platforms having common gate stacks.

Turning now to a more detailed description of aspects of the present invention, FIG. 1 depicts a cross-sectional view of a structure 100 having a substrate 102 during an intermediate operation of a method of fabricating a CMOS device according to one or more embodiments of the invention. The substrate 102 includes an NMOS region 104 adjacent to a PMOS region 106. A hard mask 108 is formed over the NMOS region 104. Exposed portions of the substrate 102 (i.e., those portions in the PMOS region 106 not covered by the hard mask 108) are recessed, using, for example, a wet etch, a dry etch, or a combination thereof. A semiconductor layer 110 having a first germanium concentration is then formed in the PMOS region 106 on the recessed portions of the substrate 102.

The substrate 102 can be any suitable substrate material, such as, for example, monocrystalline Si, SiC, III-V compound semiconductor, II-VI compound semiconductor, or semiconductor-on-insulator (SOI). In some embodiments, the substrate 102 includes a buried oxide layer (not depicted). In some embodiments of the present invention, the substrate 102 is silicon.

The semiconductor layer 110 can be any suitable PMOS material, such as, for example, silicon germanium (SiGe). In some embodiments of the present invention, the substrate 102 is silicon and the semiconductor layer 110 is epitaxially grown SiGe. Epitaxially growing SiGe on silicon advantageously strains the SiGe layer due to the difference in lattice constants between silicon and SiGe.

As previously discussed herein, the critical thickness of $Si_{1-x}Ge_x$ epitaxial growth on silicon limits the germanium concentration of the semiconductor layer 110. In some embodiments of the present invention, the semiconductor layer 110 is SiGe having a germanium concentration of less than about 25 atomic percent to satisfy critical thickness requirements. For example, the germanium concentration can be about 10 to about 20 atomic percent. The semiconductor layer 110 can be formed to a thickness of about 10 nm to about 100 nm. In some embodiments of the present invention, the semiconductor layer 110 is SiGe20% (i.e., SiGe including 20 atomic percent germanium) having a thickness of about 50 nm.

The semiconductor layer 110 can be formed by selective epitaxial growth over the substrate 102 in the PMOS region 106. The semiconductor layer 110 can be grown from gaseous or liquid precursors using vapor-phase epitaxy (VPE), molecular-beam epitaxy (MBE), liquid-phase epitaxy (LPE), or other suitable processes. In some embodiments of the present invention, the gas source for the deposition of epitaxial semiconductor material includes both a silicon containing gas source and a germanium containing gas source. Silicon gas sources can be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Germanium gas sources can be selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

The semiconductor layer 110 can be doped during deposition (in-situ doped) or doped following the epitaxy by adding n-type dopants (e.g., As, P, Sb) or p-type dopants (e.g., Ga, B, $BF_2$, Al), depending on the type of transistor (i.e., n-type dopants for an nFET and p-type dopants for a pFET). The dopant concentration in the semiconductor layer 110 can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$.

Figure 2:
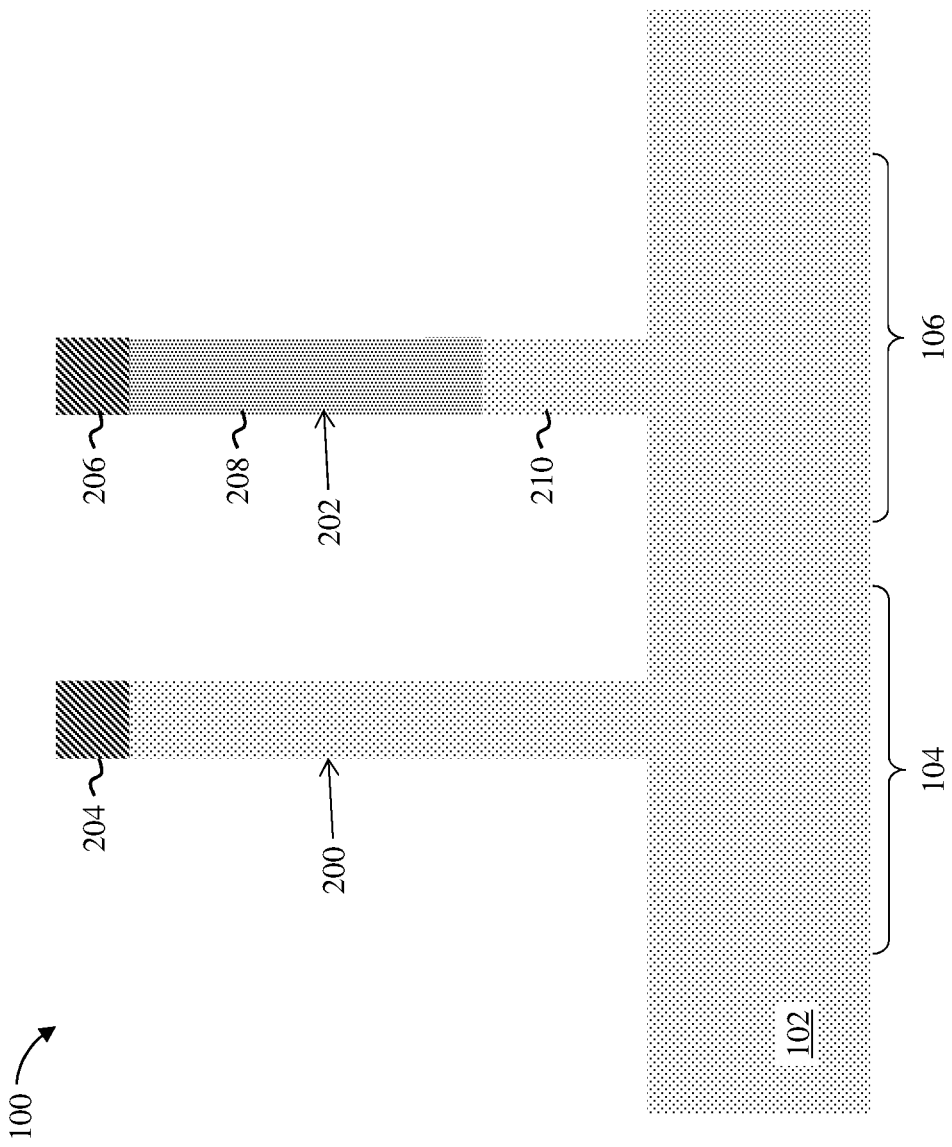
FIG. 2 depicts a cross-sectional view of the semiconductor structure after a processing operation according to one or more embodiments of the present invention.

FIG. 2 depicts a cross-sectional view of the structure 100 after forming an nFET fin 200 in the NMOS region 104 and a pFET fin 202 in the PMOS region 106 during an intermediate operation of a method of fabricating a CMOS device according to one or more embodiments of the invention. The nFET fin 200 and the pFET fin 202 can be formed on the substrate 102 using known front-end-of-line (FEOL) fabrication techniques.

In some embodiments of the invention a hard mask 204 is patterned to expose portions of the substrate 102 in the NMOS region 104. The exposed portions of the substrate 102 can then be removed to form a plurality of semiconductor fins using an etch process, which can be a wet etch process, a dry etch process or a combination thereof. In a similar manner, a hard mask 206 can be patterned in the PMOS region 106 to expose portions of the semiconductor layer 110. The exposed portions of the semiconductor layer 110 can be removed using a wet etch, a dry etch, or a combination thereof. In some embodiments of the present invention, exposed portions of the substrate 102 are removed after removing portions of the semiconductor layer 110. In this manner, a pFET fin 202 having a top section 208 (formed from the semiconductor layer 110 having a first germanium concentration) and a bottom section 210 (formed from the substrate 102) is provided. In some embodiments of the present invention, the nFET fin 200 and the pFET fin 202 are patterned at the same time using RIE selective to the hard masks 204 and 206.

The nFET fin 200 and the pFET fin 202 can each have a height ranging from 1 nm to 150 nm. In some embodiments of the present invention, the top section 208 of the pFET fin 202 is formed to a height of about 50 nm. Each of the fins can have a width ranging from 5 nm to 40 nm. The fins can be separated by a pitch ranging from 10 nm to 100 nm.

Figure 3:
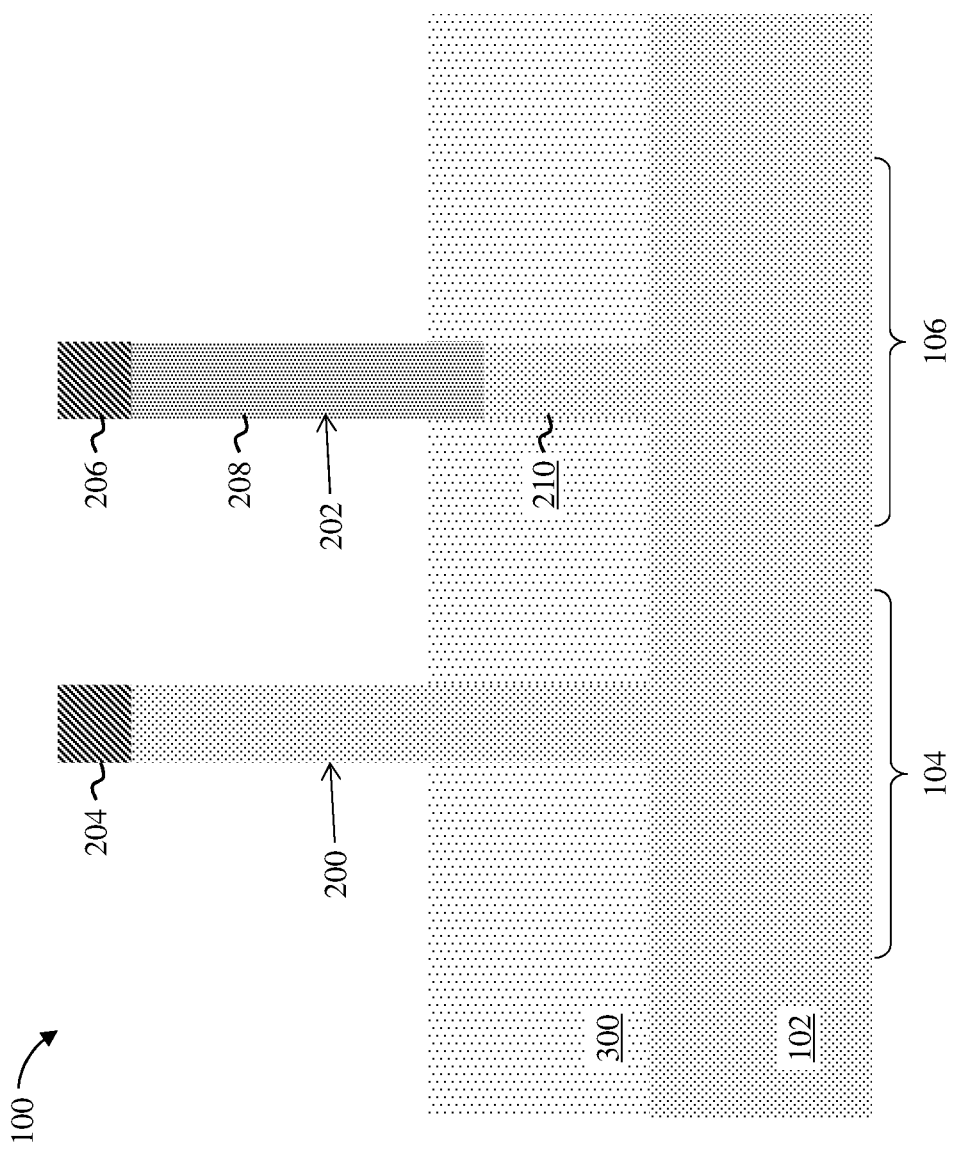
FIG. 3 depicts a cross-sectional view of the semiconductor structure after a processing operation according to one or more embodiments of the present invention.

FIG. 3 depicts a cross-sectional view of the structure 100 after forming a shallow trench isolation (STI) 300 over the substrate 102 during an intermediate operation of a method of fabricating a CMOS device according to one or more embodiments of the invention. The STI 300 is formed over the substrate 102 and between the nFET fin 200 and the pFET fin 202. The STI 300 can be any suitable dielectric material, such as, for example, a silicon oxide, and can be formed using any suitable process. In some embodiments of the present invention, the STI 300 is overfilled above a surface of the hard masks 204 and 206 and then planarized to the surface of the hard masks 204 and 206 using, for example, CMP. The STI 300 is then recessed using, for example, chemical oxide removal (COR). In some embodiments of the present invention, the STI 300 is recessed to provide an active fin length of about 35 nm (i.e., a fin length above the STI 300), although other active fin lengths are within the contemplated scope of the invention.

Figure 4:
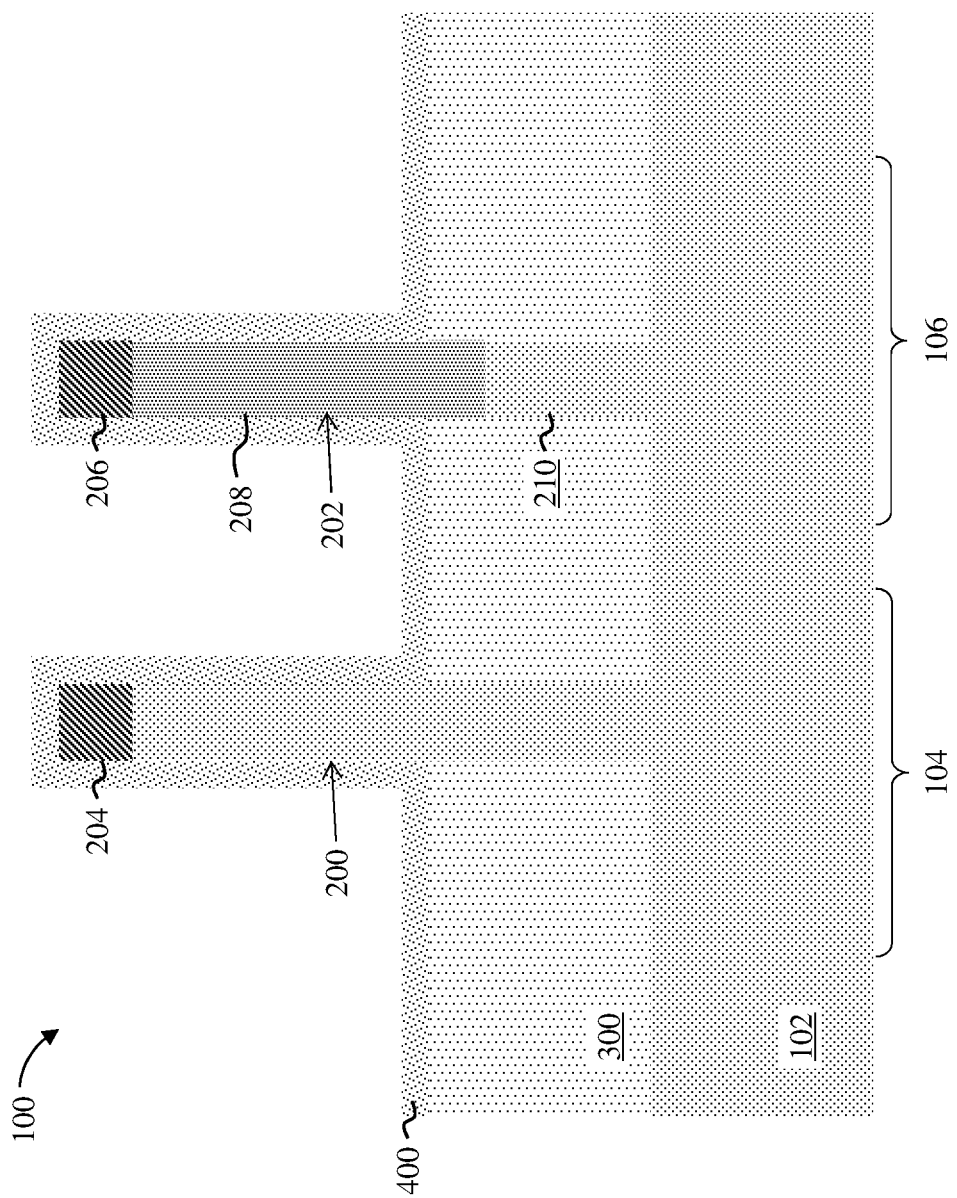
FIG. 4 depicts a cross-sectional view of the semiconductor structure after a processing operation according to one or more embodiments of the present invention.

FIG. 4 depicts a cross-sectional view of the structure 100 after forming an oxide layer 400 over the STI 300, the nFET fin 200, and the pFET fin 202 during an intermediate operation of a method of fabricating a CMOS device according to one or more embodiments of the invention. The oxide layer 400 includes germanium and can be conformally formed using ALD or another suitable process. In some embodiments of the present invention, the oxide layer 400 is conformally formed to a thickness of about 1 nm to about 10 nm, for example 5 nm, although other thicknesses are within the contemplated scope of the invention.

Figure 5:
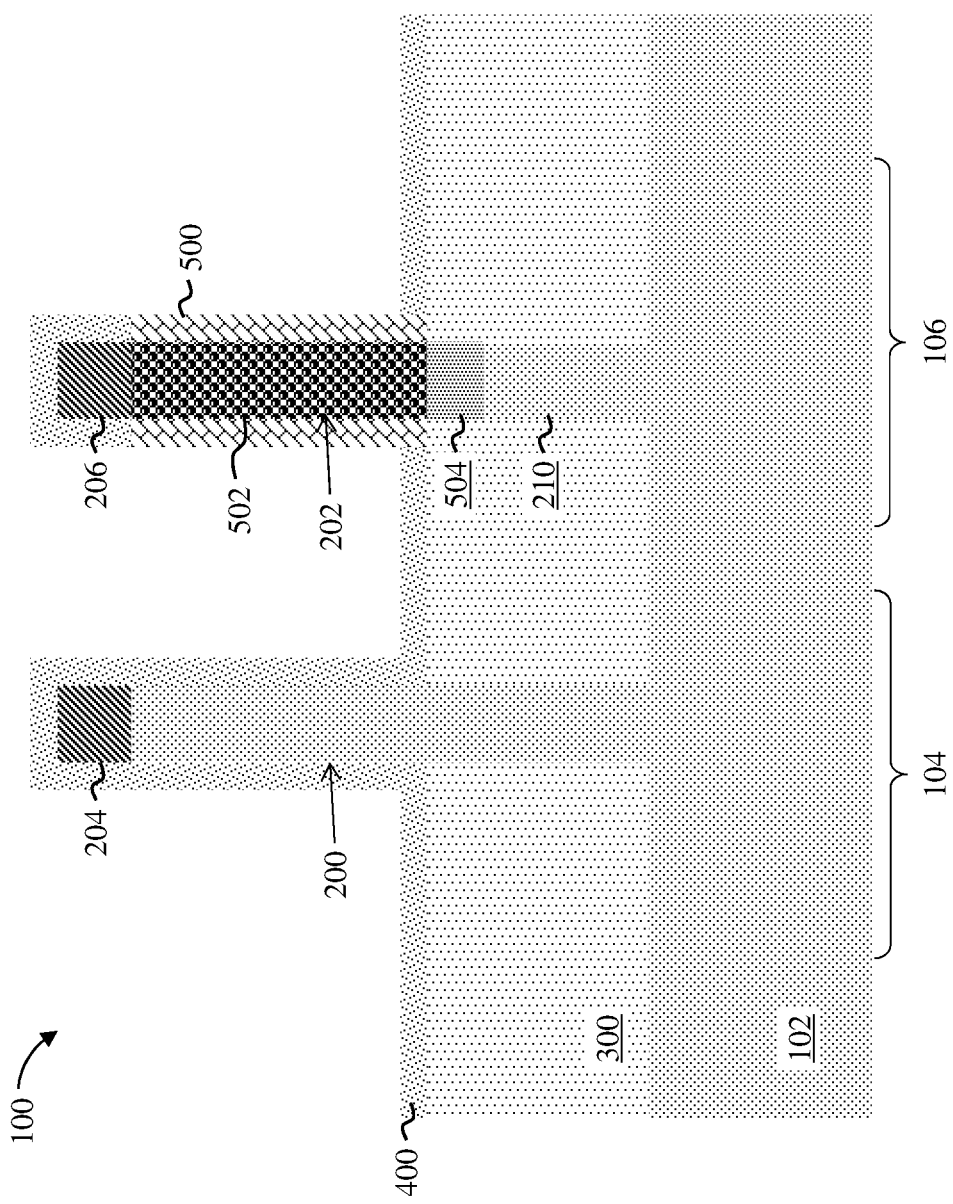
FIG. 5 depicts a cross-sectional view of the semiconductor structure after a processing operation according to one or more embodiments of the present invention.

FIG. 5 depicts a cross-sectional view of the structure 100 after converting a portion of the oxide layer 400 in contact with a portion of the top section 208 of the pFET fin 202 into a second oxide layer 500 during an intermediate operation of a method of fabricating a CMOS device according to one or more embodiments of the invention. In some embodiments of the present invention, the oxide layer 400 includes $GeO_2$, the top section 208 of the pFET fin 202 includes SiGe20%, and a low temperature anneal causes some of the Si in the top section 208 above a surface of the STI 300 to oxidize into the oxide layer 400 (forming, i.e., the second oxide layer 500 including $SiO_2$ and a top section 502 of the pFET fin 202) according to the reaction scheme (I):

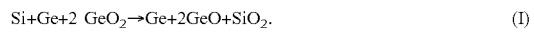

$$Si + Ge + 2\ GeO_2 \rightarrow Ge + 2GeO + SiO_2. \qquad (I)$$

Advantageously, this low temperature anneal can be carried out at about 500 degrees Celsius to about 700 degrees Celsius without oxygen ambient. Moreover, without germanium there is no reaction between silicon and $GeO_2$ in the nFET fin 200. In this manner the reaction scheme (I) allows for the selective condensation of germanium in the pFET fin 202 in a CMOS compatible process that can be performed over both the NMOS and PMOS regions 104 and 106. After the low temperature anneal the volatile species GeO can be extracted, for example, by purging a chamber in which the reaction is conducted with an inert gas.

Following the reaction (I) the pFET fin 202 includes three materially distinct portions: (1) the bottom section 210 formed from the substrate 102; (2) the top section 502 having a high Ge concentration formed by Ge condensation; and (3) a middle section 504 having a low Ge concentration corresponding to the remaining portions of the top section 208, i.e., those unreacted portions of the top section 208 which were not in contact with the oxide layer 400 due to being below a surface of the STI 300.

In some embodiments of the present invention, the bottom section 210 is formed from a silicon substrate 102 and includes no germanium or only trace germanium. The middle section 504 of the pFET fin 202 is formed from the semiconductor layer 110 having a first germanium concentration. In some embodiments of the present invention, the first germanium concentration is about 20 atomic percent. As discussed previously herein, the reaction scheme (I) selectively condenses germanium by oxidizing silicon to form the second oxide layer 500 and the top section 502 of the pFET fin 202. Consequently, the selective condensation increases the germanium concentration of the top section 502 relative to the middle section 504. In some embodiments of the present invention, the top section 502 includes a second germanium concentration of about 40 atomic percent, although other concentrations are within the contemplated scope of the invention. The second germanium concentration can be further increased by increasing a thickness of the oxide layer 400, or by removing the unreacted $GeO_2$, the and repeating the process (i.e., forming a new oxide layer over the pFET fin 202 and selectively condensing additional Ge in the top section 502).

Figure 6:
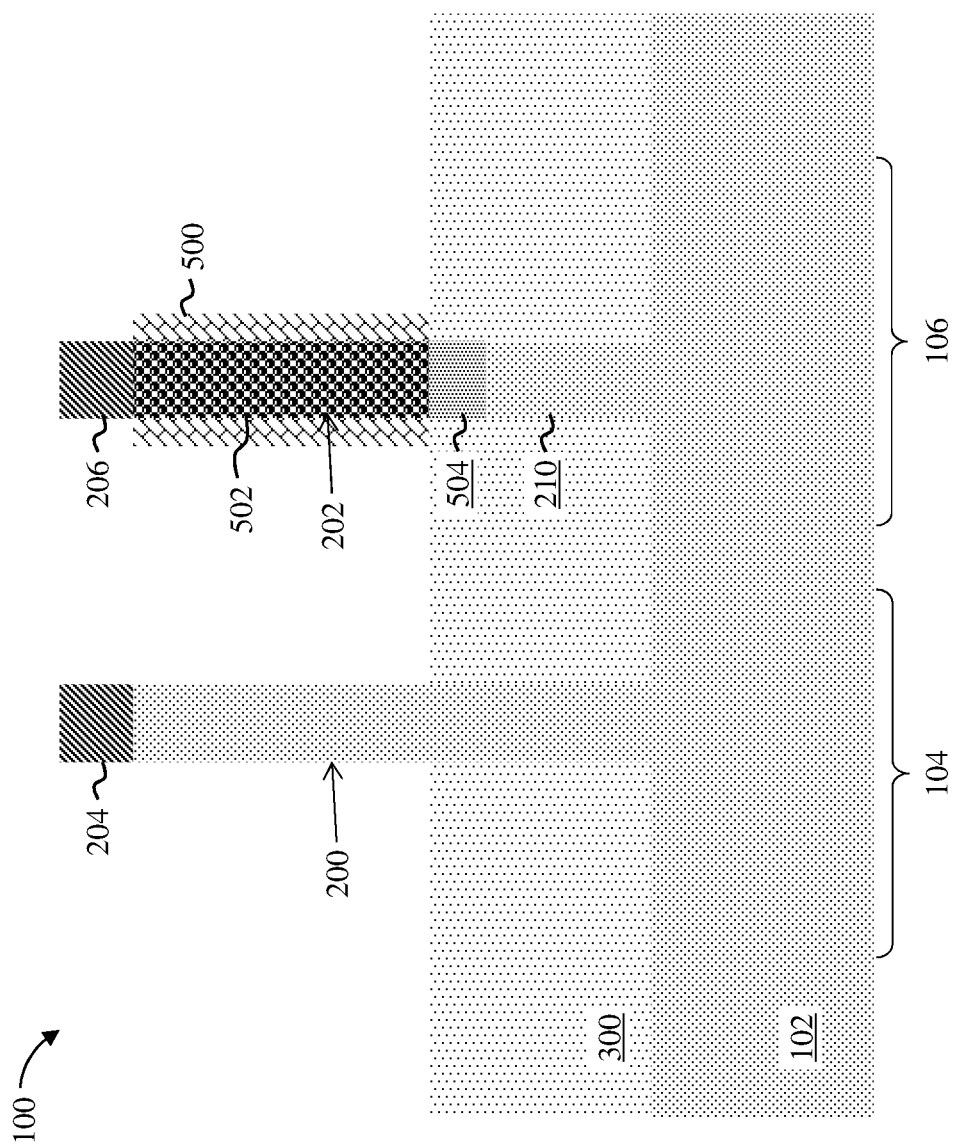
FIG. 6 depicts a cross-sectional view of the semiconductor structure after a processing operation according to one or more embodiments of the present invention.

FIG. 6 depicts a cross-sectional view of the structure 100 after removing unreacted portions of the oxide layer 400 during an intermediate operation of a method of fabricating a CMOS device according to one or more embodiments of the invention. The oxide layer 400 can be removed using a wet etch, a dry etch, or a combination thereof. In some embodiments of the present invention, the oxide layer 400 is removed selective to the nFET fin 200, the second oxide layer 500, and/or the top section 502 of the pFET fin 202. In some embodiments of the present invention, the oxide layer 400 is removed using deionized water.

Figure 7:
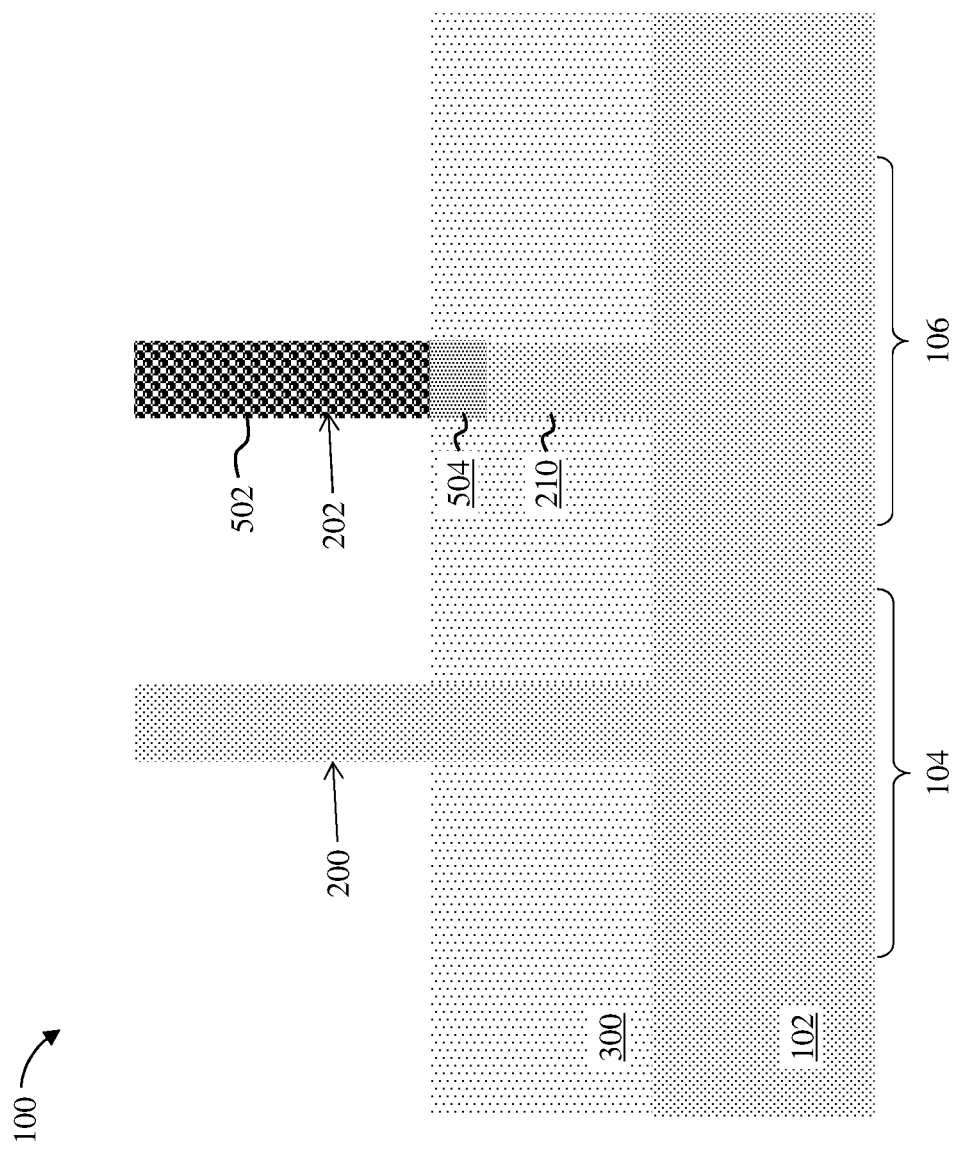
FIG. 7 depicts a cross-sectional view of the semiconductor structure after a processing operation according to one or more embodiments of the present invention.

FIG. 7 depicts a cross-sectional view of the structure 100 after removing the second oxide layer 500 and the hard masks 204 and 206 during an intermediate operation of a method of fabricating a CMOS device according to one or more embodiments of the invention. The oxide layer 500 can be removed using a wet etch, a dry etch, or a combination thereof. In some embodiments of the present invention, the oxide layer 500 is removed using RIE selective to the hard masks 204 and 206. The hard masks 204 and 206 can then be removed using known hard mask open (HMO) processes.

In some embodiments of the present invention, exposed surfaces of the nFET fin 200 and pFET fin 202 are cleaned to remove impurities and contaminants. The exposed surfaces can be cleaned using, for example, dilute hydrofluoric acid and/or hydrochloric acid.

Figure 8:
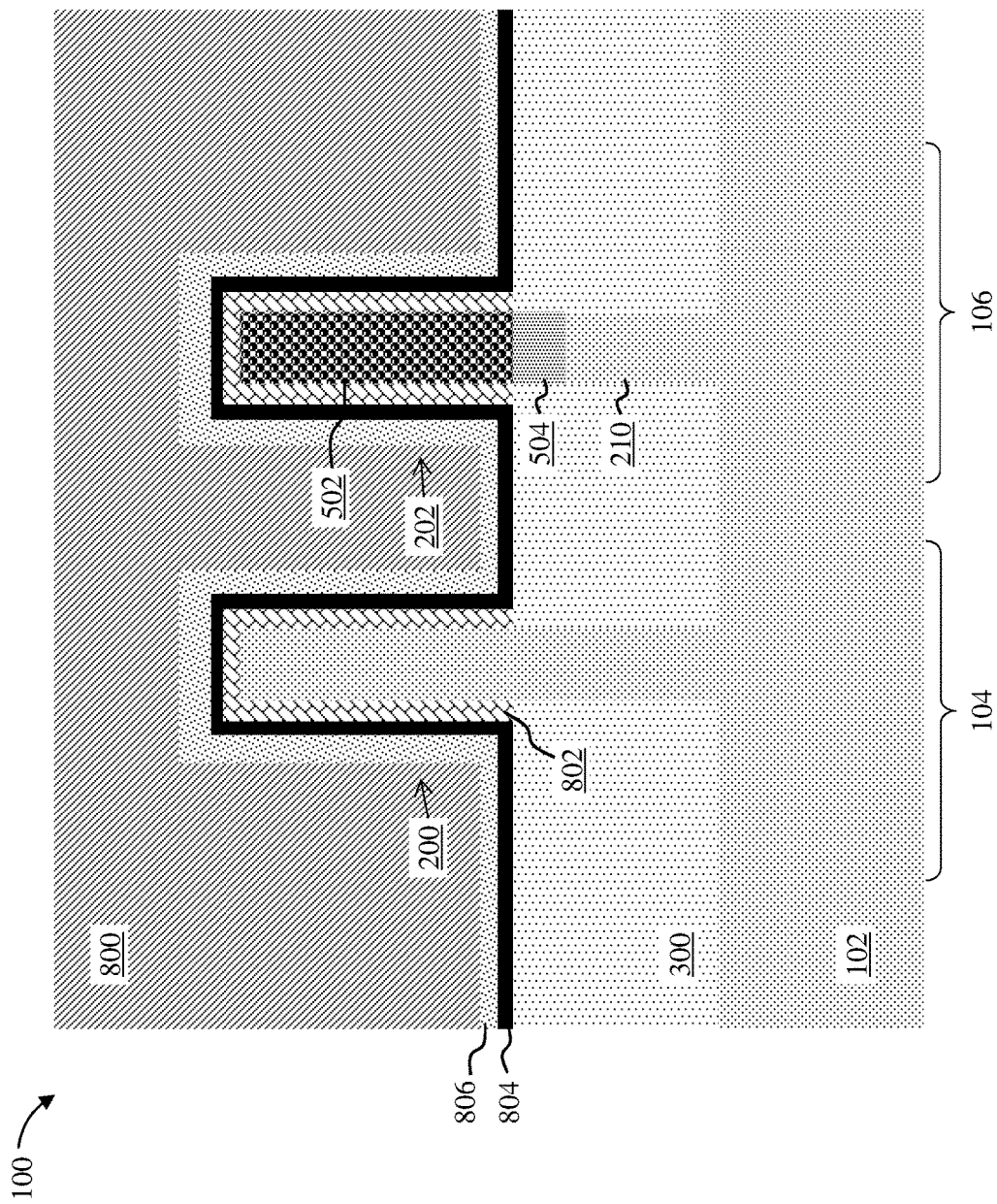
FIG. 8 depicts a cross-sectional view of the semiconductor structure after a processing operation according to one or more embodiments of the present invention.

FIG. 8 depicts a cross-sectional view of the structure 100 after forming a conductive gate 800 (also known as a common or shared gate) over the nFET fin 200 and pFET fin 202 during an intermediate operation of a method of fabricating a CMOS device according to one or more embodiments of the invention. The conductive gate 800 is formed over channel regions of the nFET fin 200 and pFET fin 202 using known processes. The conductive gate 800 can be a high-k metal gate (HKMG) and can include, for example, an interfacial layer (IL) 802, a high-k dielectric film 804, and a work function metal (WFM) 806 (the IL 802, high-k dielectric film 804, and WFM 806 are collectively referred to as the gate stack).

In a conventional device the gate stack depends on the type of transistor and differs between the nFET and pFET devices. As previously mentioned herein, however, the channel region of the pFET 202 (i.e., the top section 502) includes SiGe having a high Ge concentration (i.e., a Ge concentration of about 40 atomic percent). This high Ge concentration lowers the band gap of the channel region of the pFET 202. Consequently, a common gate stack having n-type work function metals can be formed over both the NMOS and PMOS regions 104 and 106.

The high-k dielectric film 804 can include a dielectric material having a dielectric constant greater than, for example, 3.9, 7.0, or 10.0. Non-limiting examples of suitable materials for the high-k dielectric film 804 include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric film 804 can further include dopants such as, for example, lanthanum and aluminum. The high-k dielectric film 804 can be formed by suitable deposition processes, for example, CVD, PECVD, atomic layer deposition (ALD), evaporation, physical vapor deposition (PVD), chemical solution deposition, or other like processes. The thickness of the high-k dielectric film 804 can vary depending on the deposition process as well as the composition and number of high-k dielectric materials used. The high-k dielectric film 804 can have a thickness in a range from about 0.5 to about 20 nm.

The WFM 806 can be disposed over the high-k dielectric film 804. P-type work function metals include compositions such as ruthenium, palladium, platinum, cobalt, nickel, and conductive metal oxides, or any combination thereof. N-type work function metals include compositions such as hafnium, zirconium, titanium, tantalum, aluminum, metal carbides (e.g., hafnium carbide, zirconium carbide, titanium carbide, and aluminum carbide), aluminides, or any combination thereof.

The WFM 806 can be a shared WFM (i.e., WFM 806 can be formed over both NMOS and PMOS regions 104 and 106) and can include a single layer or two or more stacked work function metals. In some embodiments of the present invention, the shared WFM 806 is a TiN/TiC/TiN three layer work function metal. In some embodiments of the present invention, the TiC layer includes Al. In some embodiments of the present invention, the shared WFM 806 is a TiN/Al-containing alloy/TiN three layer work function metal. The shared WFM 806 can be deposited by a suitable deposition process, for example, CVD, PECVD, PVD, plating, thermal or e-beam evaporation, and sputtering.

The bulk material (gate conductor material) for the conductive gate 800 can be deposited over the high-k dielectric film 804 and the WFM 806 to form a HKMG. Non-limiting examples of suitable conductive materials include aluminum (Al), platinum (Pt), gold (Au), tungsten (W), titanium (Ti), or any combination thereof. The gate conductor material can be deposited by a suitable deposition process, for example, CVD, PECVD, PVD, plating, thermal or e-beam evaporation, and sputtering.

Conductive contacts (gate contacts and source/drain contacts, not depicted) can be formed or deposited using known metallization techniques. In some embodiments, an ILD is patterned with open trenches and the contacts are deposited into the trenches. In some embodiments, the contacts are overfilled into the trenches, forming overburdens above a surface of the ILD. In some embodiments, a CMP selective to the ILD removes the overburden. The contacts can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments, the contacts can be copper and can include a barrier metal liner. The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

Figure 9:
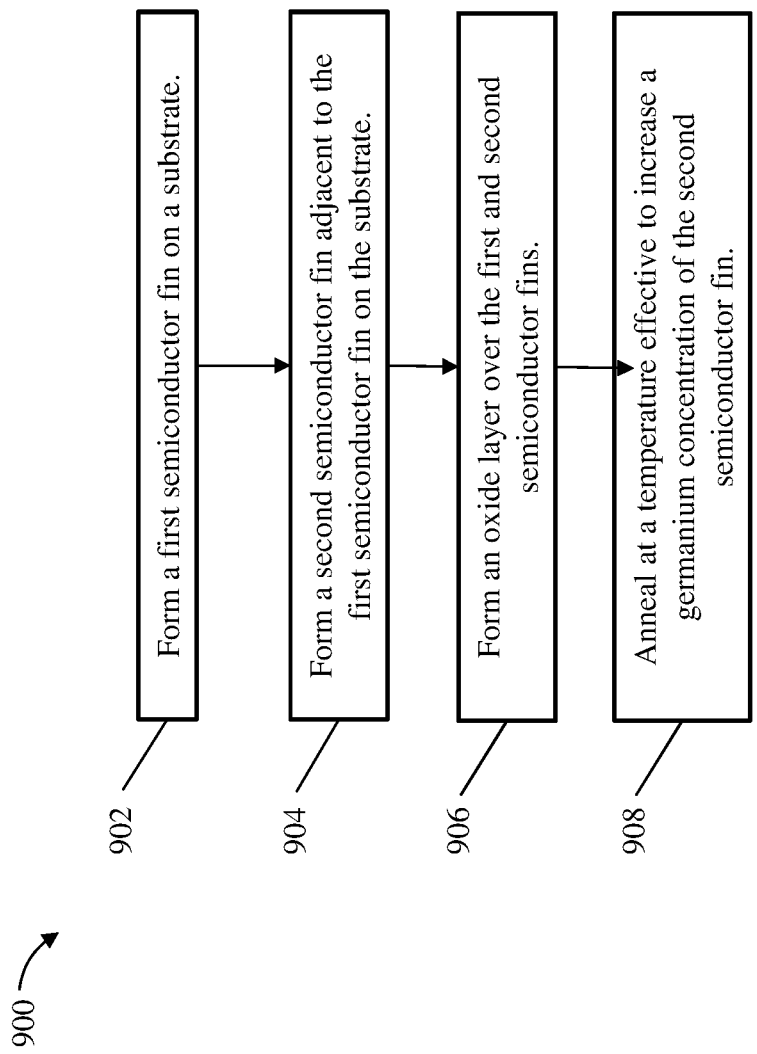
FIG. 9 depicts a flow diagram illustrating a method according to one or more embodiments of the invention.

FIG. 9 depicts a flow diagram illustrating a method for forming a semiconductor device according to one or more embodiments of the invention. As shown at block 902, a first semiconductor fin is formed on a substrate. At block 904 a second semiconductor fin is formed on the substrate and adjacent to the first semiconductor fin. The first and second semiconductor fins can be formed using known front-end-of-line (FEOL) fabrication techniques according to one or more embodiments of the present invention.

As shown at block 906, an oxide layer is formed over the first and second semiconductor fins. The oxide layer can include germanium and can be formed in a similar manner as the oxide layer 400 (as depicted in FIG. 4).

As shown at block 908, the oxide layer is annealed at a temperature effective to increase a germanium concentration of the second semiconductor fin. In some embodiments of the present invention, the anneal causes germanium in the oxide layer to condense into a portion of the second semiconductor fin according to one or more embodiments of the present invention.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and can not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a first semiconductor fin on a substrate;
    forming a second semiconductor fin on the substrate;
    forming an oxide layer over the first and second semiconductor fins; and
    annealing the oxide layer at a temperature effective to increase a germanium concentration of the second semiconductor fin;
    wherein said annealing does not increase a germanium concentration of the first semiconductor fin.

2. The method of claim 1, wherein the oxide layer comprises germanium.

3. The method of claim 2, wherein increasing the germanium concentration of the second semiconductor fin further comprises condensing the germanium in the oxide layer into a portion of the second semiconductor fin.

4. The method of claim 1, wherein the second semiconductor fin comprises silicon germanium.

5. The method of claim 4, wherein increasing the germanium concentration of the second semiconductor fin further comprises oxidizing the silicon in the second semiconductor fin.

6. The method of claim 1 further comprising forming a shared conductive gate over a channel region of the first and second semiconductor fins.

7. The method of claim 6, wherein the shared conductive gate comprises a TiN/TiAlC/TiN gate stack.

8. The method of claim 1, wherein the first semiconductor fin comprises silicon and the second semiconductor fin comprises silicon germanium.

9. The method of claim 8, wherein prior to said annealing the second semiconductor fin further comprises a germanium concentration of about 20 atomic percent.

10. The method of claim 9, wherein after said annealing the second semiconductor fin further comprises a germanium concentration of about 40 atomic percent.

11. A method for forming a dual channel complementary metal-oxide-semiconductor (CMOS) device, the method comprising:
recessing a portion of a silicon substrate;
forming a semiconductor layer comprising silicon germanium on the recessed portion of the silicon substrate;
forming a first semiconductor fin over an unrecessed portion of the substrate;
forming a second semiconductor fin over the semiconductor layer;
forming an oxide layer comprising germanium over the first and second semiconductor fins;
annealing the oxide layer at a temperature effective to increase a germanium concentration of the second semiconductor fin; and
forming a shared conductive gate over a channel region of the first and second semiconductor fins.

12. The method of claim 11, wherein the second semiconductor fin comprises silicon germanium.

13. The method of claim 11, wherein the shared conductive gate comprises a TiN/TiAlC/TiN gate stack.

14. The method of claim 11, wherein prior to said annealing the second semiconductor fin further comprises a germanium concentration of about 20 atomic percent.

15. The method of claim 14, wherein after said annealing the second semiconductor fin further comprises a germanium concentration of about 40 atomic percent.

16. A method for forming a semiconductor device, the method comprising:
forming a semiconductor fin comprising silicon and germanium on a substrate;
forming an oxide layer comprising germanium over the semiconductor fin; and
annealing the oxide layer at a temperature effective to increase a germanium concentration of the semiconductor fin;
wherein said annealing oxidizes silicon in the semiconductor fin according to the reaction:

$$Si + Ge + 2\ GeO_2 \rightarrow SiO_2 + Ge + GeO. \tag{I}$$

* * * * *